United States Patent [19]

Suzuki

[11] Patent Number: 5,691,574
[45] Date of Patent: Nov. 25, 1997

[54] SEMICONDUCTOR DEVICE CAPABLE OF HIGH SPEED OPERATION AND BEING INTEGRATED WITH HIGH DENSITY

[75] Inventor: Kazumasa Suzuki, Tokyo, Japan

[73] Assignee: NEC Corporation, Tokyo, Japan

[21] Appl. No.: 719,586

[22] Filed: Sep. 25, 1996

Related U.S. Application Data

[63] Continuation of Ser. No. 307,003, Sep. 16, 1994, abandoned.

[30] Foreign Application Priority Data

Sep. 27, 1993 [JP] Japan .................. 5-238615

[51] Int. Cl.⁶ .................................................. H01L 23/48
[52] U.S. Cl. .................................. 257/758; 257/390
[58] Field of Search .................. 257/206, 375, 257/377, 758, 368, 401, 390

[56] References Cited

U.S. PATENT DOCUMENTS

| | | | |
|---|---|---|---|
| 4,816,895 | 3/1989 | Kikkawa | 257/758 |
| 5,079,614 | 1/1992 | Khatakhotan | 257/206 |
| 5,237,199 | 8/1993 | Morita | 257/758 |

FOREIGN PATENT DOCUMENTS

| | | | |
|---|---|---|---|
| 2-239646 | 9/1990 | Japan | 257/758 |
| 3-248567 | 11/1990 | Japan | 257/377 |
| 3-209830 | 9/1991 | Japan | 257/758 |
| 5-41455 | 2/1993 | Japan | 257/758 |

Primary Examiner—Mahshid D. Saadat
Assistant Examiner—Nathan K. Kelley
Attorney, Agent, or Firm—Young & Thompson

[57] ABSTRACT

In a semiconductor device including a plurality of semiconductor cells each of which has a diffusion area, a first metal layer, and a connecting portion, the first metal layer overlies whole of the diffusion area while the connecting portion covers almost whole of the diffusion area. The semiconductor device further includes a second metal layer, and first and second power supply lines. The second metal layer has an interconnecting area positioned above the semiconductor cells and an overlapping area overlapping on the first metal layer. Each of the first and the second power supply lines consists of the overlapping area. The semiconductor cells are electrically connected to each other by a third metal layer and the interconnecting area of the second metal layer.

11 Claims, 6 Drawing Sheets

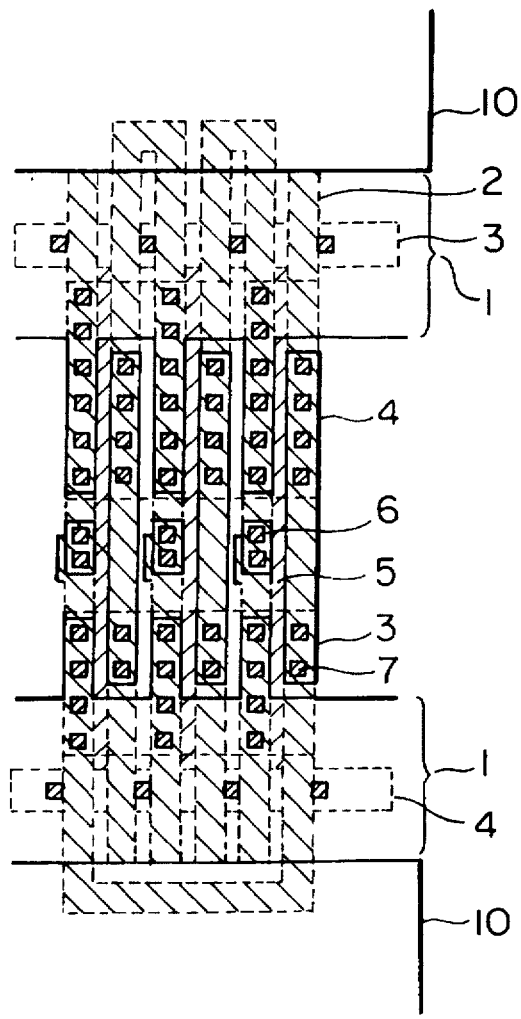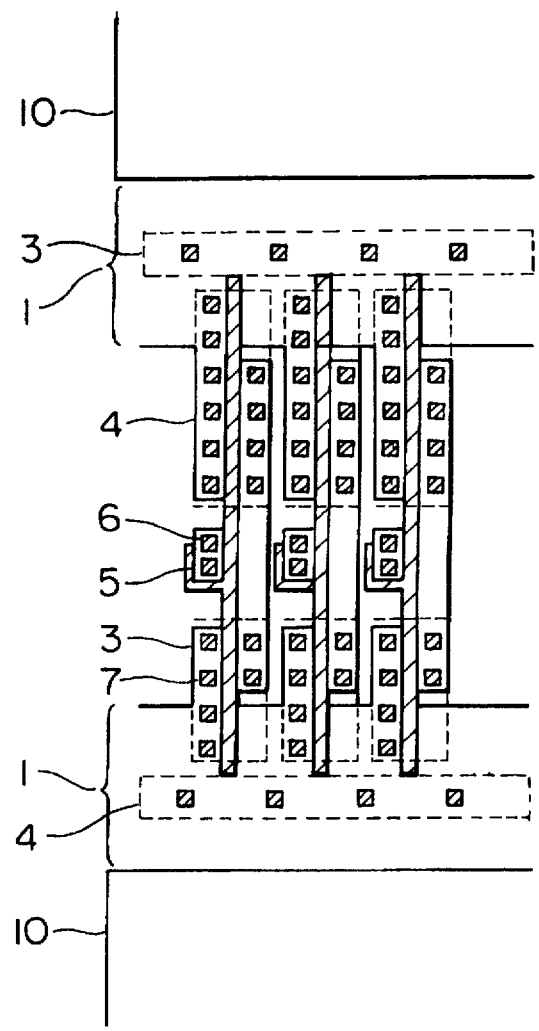
PRIOR ART
FIG. 2A
PRIOR ART
FIG. 2B

SEMICONDUCTOR DEVICE CAPABLE OF HIGH SPEED OPERATION AND BEING INTEGRATED WITH HIGH DENSITY

This application is a continuation of application Ser. No. 08/307,003, filed Sep. 16, 1994, now abandoned.

BACKGROUND OF THE INVENTION

1. Field of the Invention

This invention relates to a semiconductor device which comprises complementary metal oxide semiconductor (CMOS) and the like, which is for use in a semiconductor integrated circuit.

2. Description of the Related Art

In such a semiconductor integrated circuit, a plurality of basic semiconductor cells are combined and electrically connected to each other to form a large scale logic circuit.

As will later be described more in detail, a conventional semiconductor device of the type described comprises a plurality of semiconductor cells each of which includes a diffusion area, first metal layers which form internal conductor patterns in the semiconductor cell. The first metal layers partially overlie the diffusion area. The semiconductor cell further comprises a plurality of contacts, second metal layers, first and second power supply terminals. The contacts connect the diffusion area to the first metal layers. The first and the second power supply terminals have comparatively large width and are composed of the first metal layers.

However, in the conventional semiconductor cell, wide portions of the first metal layers which define the first and the second power supply terminals partially overlie the diffusion area. It is not possible that the contacts are formed to cover almost all of the diffusion area. As a result, a parasitic resistance of the diffusion area inevitably prevents high speed operation of the conventional semiconductor cell.

In order to make it possible that the contacts are formed to cover almost all of the diffusion area, it should be abolished that the first metal layers which define the first and the second power supply terminals are overlapping on the diffusion area. However, when such an overlap is abolished, the conventional semiconductor cell becomes large in size, so that the conventional semiconductor device, as a whole, would also be too large in size.

Furthermore, in the conventional semiconductor device, it is necessary that patterning spaces are preserved at both sides of the semiconductor device. In other words, the second metal layers are made to be extended up to the patterning spaces at the both sides so as to electrically connect the semiconductor cells with each other. In this event, length of wiring patterns between the semiconductor cells inevitably becomes large. Therefore, the conventional semiconductor device becomes so large in size by the patterning spaces which should be preserved at the both sides. Accordingly, it becomes difficult that the conventional semiconductor devices are integrated in an IC or an LSI circuit with high density.

SUMMARY OF THE INVENTION

It is therefore an object of this invention to provide a semiconductor device which is operable at a high speed and which is able to be integrated with high density.

Other objects of this invention will become clear as the description proceeds.

According to an aspect of the present invention, there is provided a semiconductor device comprising: (A) a plurality of semiconductor cells each of which includes; (A1) a diffusion area; (A2) a first metal layer which overlies all of the diffusion area and which forms internal conductor patterns; (A3) a connecting portion for connecting the diffusion area to the first metal layer; the connection portion covering almost all of the diffusion area; (B) a second metal layer which has an interconnecting area positioned above the semiconductor cells; the first and the second metal layers having an overlapping area overlapping on each other; (C) a third metal layer; (D) first and second power supply lines each of which consists of the overlapping area; and (E) the semiconductor cells electrically connected to each other by the third metal layer and the interconnecting area of the second metal layer.

The connecting portion comprises a plurality of contacts. The connecting portion may comprise a contact covering almost all of the diffusion area.

BRIEF DESCRIPTION OF THE DRAWINGS

FIG. 2A is a schematic plan view of a conventional semiconductor device;

FIG. 2B is another schematic plan view of the conventional semiconductor device illustrated in FIG. 2A, in which second metal layers have not yet been provided;

DESCRIPTION OF THE PREFERRED EMBODIMENT

Figure 1:
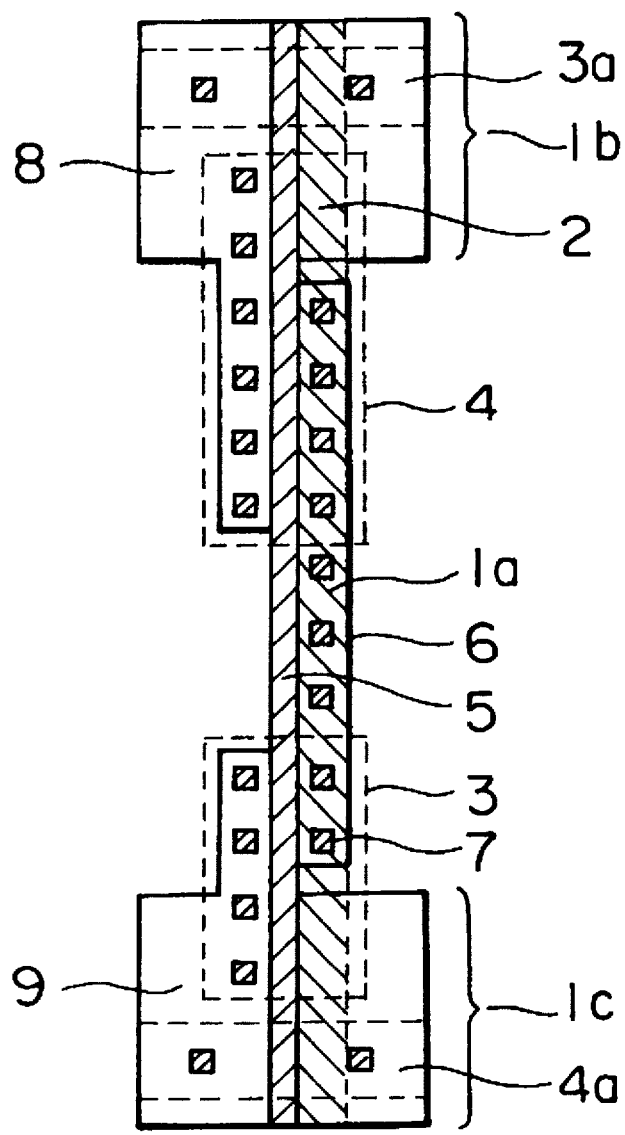
FIG. 1 is a schematic plan view of a conventional semiconductor cell.
Figure 3:
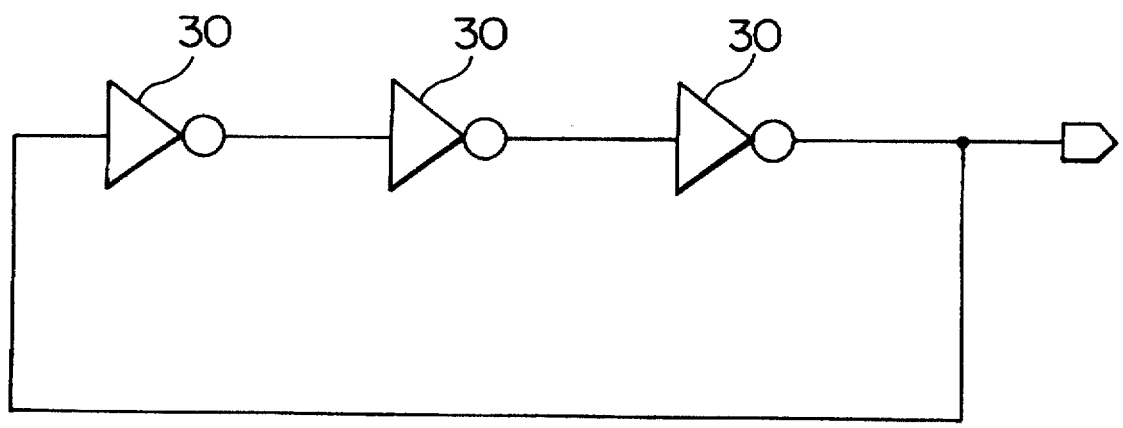
FIG. 3 is a circuit diagram of a ring oscillator circuit to which the conventional semiconductor device is applied.

Referring to FIGS. 1 to 3, conventional semiconductor cell and device will first be described for a better understanding of this invention.

In FIG. 1, illustration is made about an inverter cell, as an example of the conventional semiconductor cell.

The inverter cell comprises an n-channel area 3, a p-channel area 4, first metal layers 1a, 1b, and 1c each of which forms an internal conductor pattern in the inverter cell. The first metal layer 1b partially overlies the p-channel area 4 while the first metal layer 1c partially overlies the n-channel area 3. The inverter cell further comprises a plurality of contact holes 7, a second metal layer 2, first and second power supply terminals 8 and 9. The contact holes 7 connect the n-channel and the p-channel areas 3 and 4 to the first metal layers 1c and 1b, respectively.

As illustrated in FIG. 1, the diffusion area of the n-channel area 3 constructing an N-type MOS transistor is positioned at one side (namely, at a lower side of a sheet of FIG. 1) while the diffusion area of the p-channel area 4 constructing a P-type MOS transistor is positioned at the other side (namely, at an upper side of a sheet of FIG. 1). The first and the second power supply terminals 8 and 9 have comparatively large width and are composed of the first metal layers 1b and 1c, respectively. In the illustrated example, the first and the second power supply terminals 8 and 9 provide a power supply and a ground, respectively. Besides, an N-type area 3a serves as a contact area connected to a well (not shown) while a P-type area 4a serves as a contact area connected to a substrate (not shown). Furthermore, the first metal layer 1a (shown by real lines in FIG. 1) and the second metal layer 2 (shown by broken lines in FIG. 1) are overlapping on each other in the plan view of FIG. 1. A throughhole 6 is for use in connecting the first metal layer 1a with the second metal layer 2. An output terminal of the inverter cell is composed of the second metal layer 2.

However, in the conventional semiconductor cell mentioned with respect to the inverter cell, wide portions of the first metal layers 1b and 1c which define the first and the second power supply terminals 8 and 9 partially overlie the diffusion areas of the p-channel area 4 and the n-channel area 3. It is not possible that the contact holes 7 are formed to cover almost all areas of the p-channel area 4 and the n-channel area 3. As a result, a parasitic resistance of the diffusion areas inevitably prevents high speed operation of the conventional semiconductor cell.

In order to make it possible that the contact holes 7 are formed to cover almost all areas of the p-channel area 4 and the n-channel area 3, it should be abolished that the first metal layers 1b and 1c which define the first and the second power supply terminals 8 and 9 are overlapping on the diffusion areas of the p-channel area 4 and the n-channel area 3. However, when such an overlap is abolished, a size of the conventional semiconductor cell becomes too large. Accordingly, it becomes difficult that the conventional semiconductor cells are integrated in a logic circuit with high density.

Referring to FIGS. 2A, 2B, and 3, illustration will be made about a conventional semiconductor device. The conventional semiconductor device comprises three inverter cells 30 (one of which is illustrated in FIG. 1) to form a ring oscillator circuit, as shown in FIG. 3.

In the conventional semiconductor device, it is necessary that patterning spaces 10 are preserved at the both sides of the semiconductor device (namely, at both a lower side of a sheet of FIG. 2A or 2B and an upper side of a sheet of FIG. 2A or 2B). In other words, the second metal layer 2 is made to be extended up to the patterning spaces 10 at the both sides so as to electrically connect the inverter cells with each other. In this event, the length of wiring patterns between the semiconductor cells inevitably becomes large. Therefore, a size of the conventional semiconductor device becomes so large by the patterning spaces 10 which should be preserved at the both sides. Accordingly, it also becomes difficult that the conventional semiconductor devices are integrated in an IC or an LSI circuit with high density.

Figure 4:
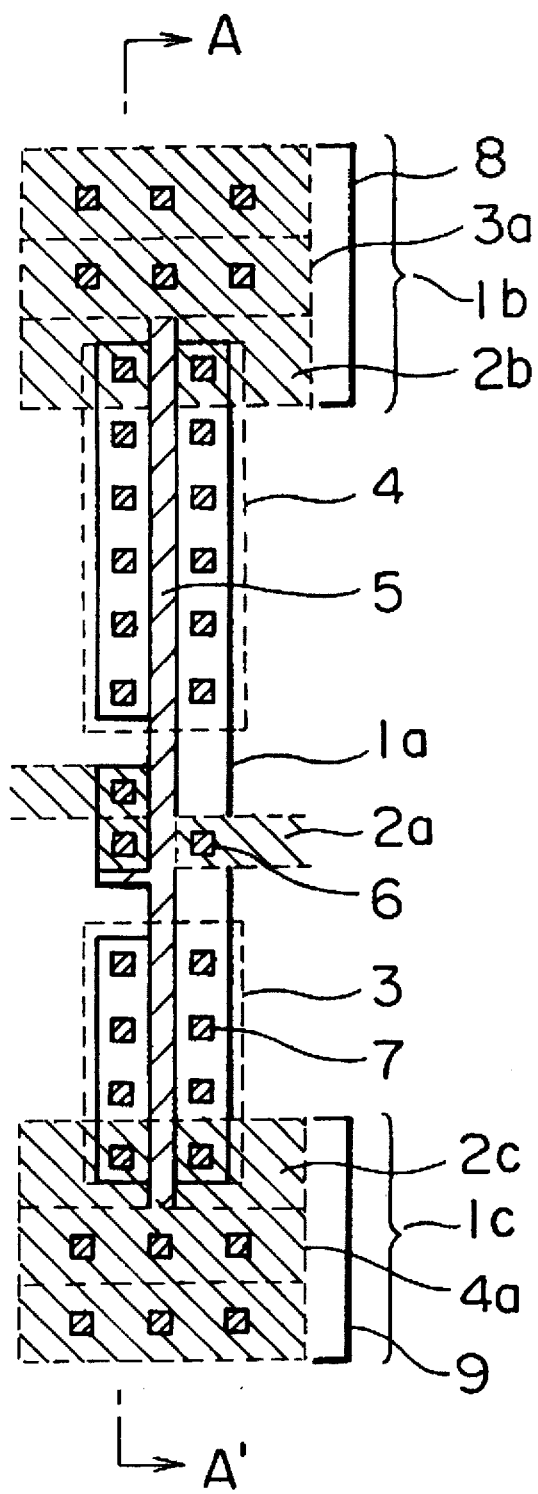
FIG. 4 is a schematic plan view of a semiconductor cell according to an embodiment of this invention.
Figure 5:
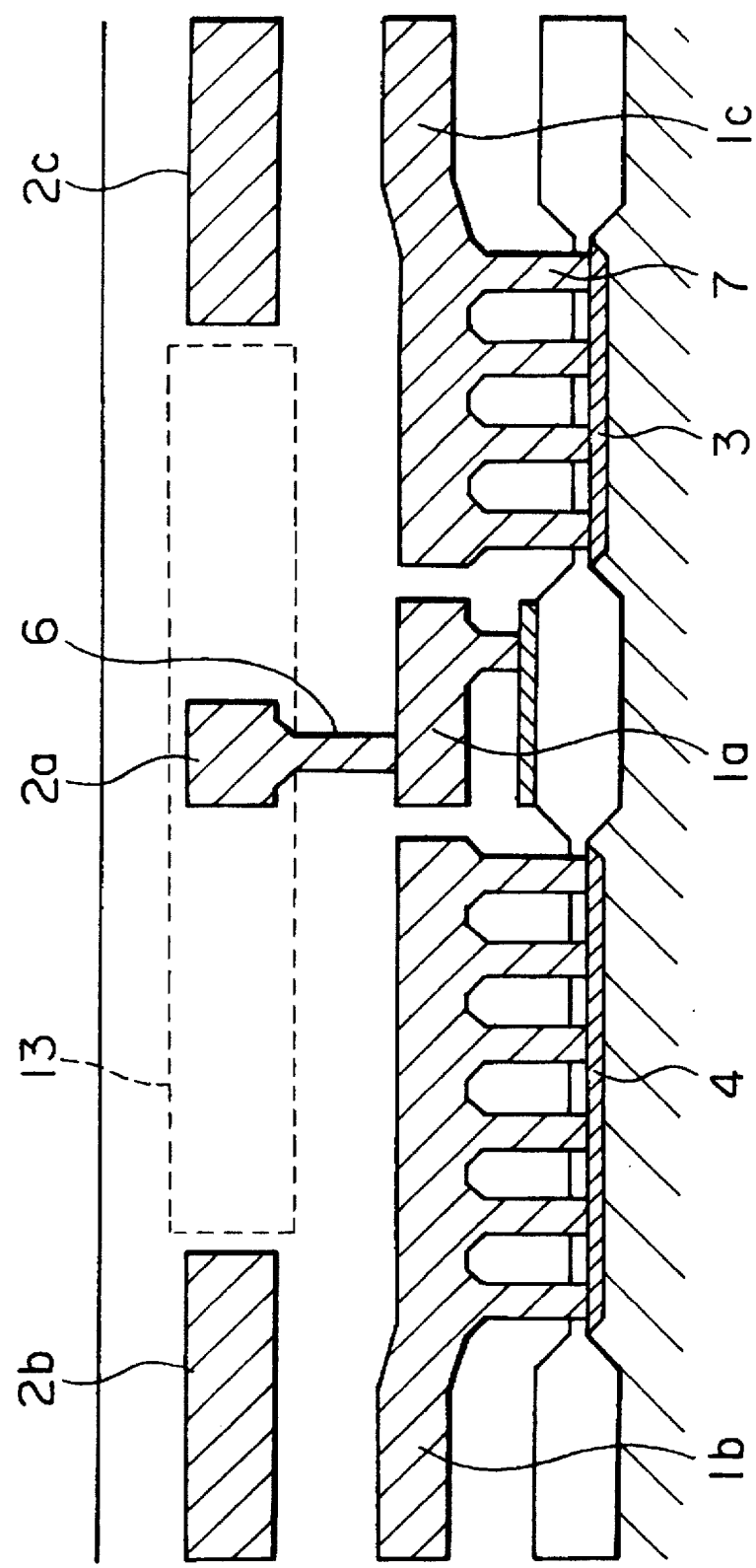
FIG. 5 is a schematic sectional view of the semiconductor cell taken across A—A' illustrated in FIG. 4.

Referring now to FIGS. 4 to 6, description will proceed to semiconductor cell and device according to an embodiment of this invention.

In FIG. 4, illustration is made about an inverter cell, a plurality of which are combined to form the semiconductor device according to the embodiment.

The inverter cell has a structure similar to that of the conventional inverter cell mentioned with reference to FIG. 1 except for the points described hereinunder. Similar portions are designated by like reference numerals.

In the illustrated inverter cell, the first metal layers 1b and 1c overlie whole areas of the p-channel and the n-channel areas 4 and 3. The contact holes 7 are provided to cover almost whole areas of the p-channel and the n-channel areas 4 and 3. As illustrated in FIGS. 4 and 5, the first metal layers 1b and 1c and the second metal layers 2b and 2c have overlapping areas when considered in a vertical direction. The first and the second power supply terminals 8 and 9 consist of the overlapping areas, respectively.

With this structure, thick power supply lines (in other words, power supply lines having large cross sections) which consist of the overlapping areas can be provided without occupying large areas in a plan view. The first metal layers 1a, 1b, and 1c and the second metal layers 2a, 2b, and 2c are electrically connected to each other by throughholes 6. Except for the first and the second power supply terminals 8 and 9, internal conductor patterns in the semiconductor cell are finished by the first metal layers 1a. Accordingly, electrical interconnection between the semiconductor cells can be readily achieved. Namely, the semiconductor cells are electrically connected to each other by the third metal layer 12 and the interconnecting area of the second metal layer 2a. Particularly, a conductor pattern of the second metal layer for signal transmission can be arranged within a space between the second metal layers 2b and 2c, as symbolized by a broken line block 13 in FIG. 5.

Figure 6A:
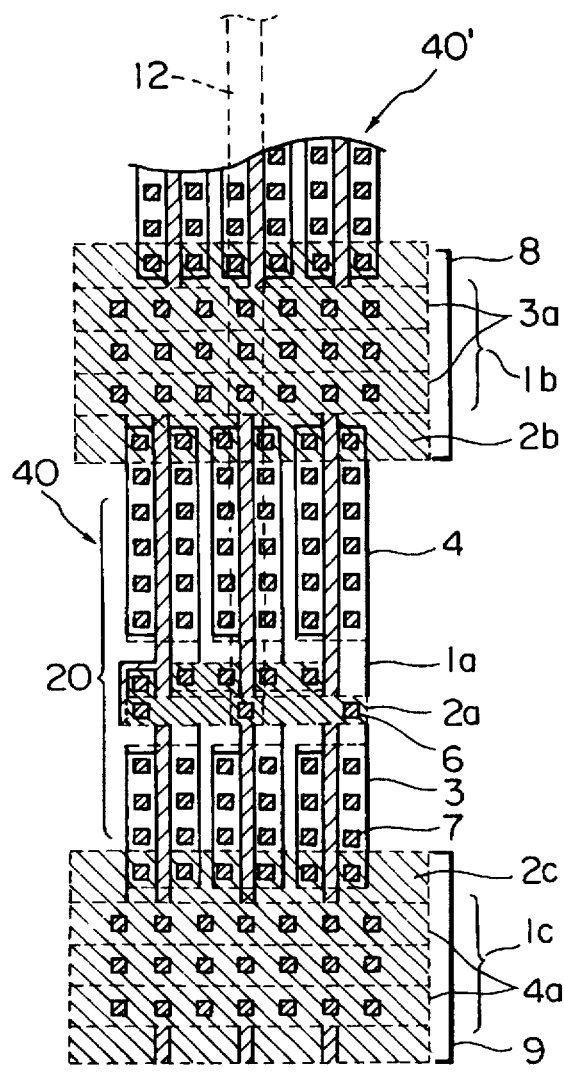
FIG. 6A is a schematic plan view of a semiconductor device according to an embodiment of this invention.
Figure 6B:
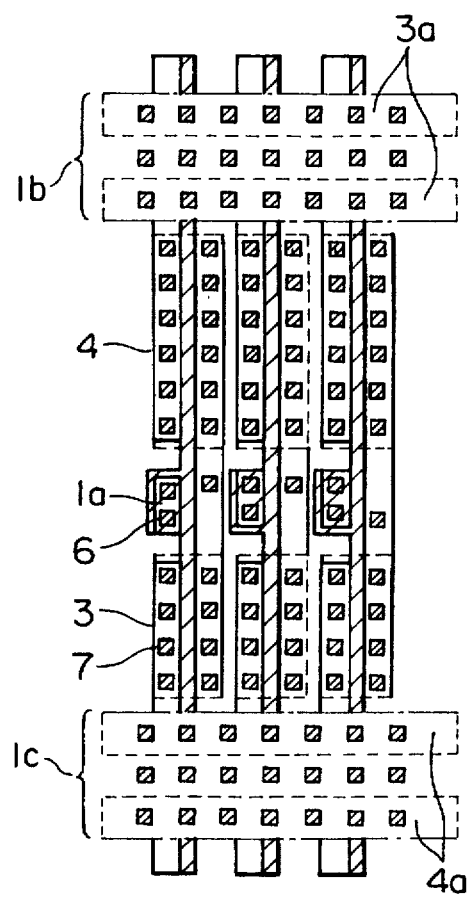
FIG. 6B is another schematic plan view of the semiconductor device illustrated in FIG. 6A, in which second metal layers have not yet been provided.

Referring to FIGS. 6A and 6B, illustration will be made about a semiconductor device 40 according to the preferred embodiment of this invention. The semiconductor device 40 comprises three inverter cells (one of which is illustrated in FIGS. 4 and 5) to form a ring oscillator circuit, as shown in FIG. 3.

In the illustrated semiconductor device 40, a conductor pattern arranging area 20 is defined between the power supply line 8 and the ground line 9. The conductor pattern arranging area 20 is formed by the above-mentioned spaces symbolized by the broken line block 13 in the three inverter cells. In the conductor pattern arranging area 20, the conductor pattern of the second metal layer 2a is arranged, as similarly mentioned before with respect to FIG. 5.

In the semiconductor device 40, for example, an interconnection between the semiconductor cells is accomplished by the second metal layer 2a. As a result, it becomes unnecessary that the second metal layers 2b and 2c are made to be extended up to the both sides of the power supply line 8 and the ground line 9. In other words, the semiconductor device 40 illustrated in FIGS. 6A and 6B does not need any patterning spaces at the both sides. Therefore, the semiconductor device 40 does not become so large in size by such patterning spaces. In addition, as suggested in FIG. 6A, adjacent semiconductor devices 40' can be arranged at the both sides in the manner that the semiconductor device 40 has the power supply line 8 or the ground line 9 in common with the adjacent semiconductor devices 40' (in FIG. 6A, illustrated is only an adjacent semiconductor device 40' positioned at the upper side of a sheet of FIG. 6A). Accordingly, it becomes possible that the semiconductor devices 40 are integrated with high density in an IC or an LSI circuit.

Besides, the semiconductor device 40 is electrically connected to the adjacent semiconductor devices 40' by the third metal layer 12, as depicted by a broken line in FIG. 6A. Furthermore, each of input and output terminals of the semiconductor cell can be formed at an optional point in the first metal layers 1b and 1c. Consequently, the interconnection between the semiconductor cells can be freely laid out.

As mentioned above, according to the present invention, a parasitic resistance in the diffusion areas is considerably decreased. An operation speed of the semiconductor cell can be so improved.

In order to confirm characteristics of the semiconductor device 40, a simulation test was carried out by the inventor of the present invention.

In the simulation test, a delay time was measured in connection with the semiconductor device 40 which comprises three chained inverters. As a result, the delay time in the semiconductor device 40 was 0.9 to 0.95 times less than that of the conventional semiconductor device. Namely, decrease of the delay time was approximately five to ten percentages. In addition, the semiconductor devices 40 can be integrated with high density in an IC or an LSI circuit, since wiring spaces for power supply or signal lines are considerably reduced in the semiconductor devices 40.

In order to confirm this advantage, two adders were fabricated. One was laid out by the use of the semiconductor device 40 while another was laid out by the use of the conventional semiconductor device. As a result of comparison of transistor density between the two adders, the adder laid out by the use of the semiconductor devices 40 could be fabricated with a transistor density about 1.5 times higher than that laid out by the conventional semiconductor devices.

While this invention has thus far been described in specific conjunction with the preferred embodiment thereof, it will now be readily possible for one skilled in the art to put this invention into effect in various other manners. For example, the semiconductor device is not restricted to such one as comprising CMOS. The semiconductor device of the present invention may comprise BiCMOS, nMOS, BinMOS, or the like. Furthermore, the connecting portion comprises a plurality of contact holes in the preferred embodiment. The connecting portion may comprise a contact hole which covers almost whole of the diffusion area.

What is claimed is:

1. A semiconductor device having a multi-level wiring structure including wiring layers at a first level and wiring layers at a second level, comprising:
    a first diffusion area and a second diffusion area in a surface of the semiconductor device spaced apart along an axis connecting said diffusion areas;
    a first power supply wiring layer at said first level extending over said axis and having end portions over extensions of said axis beyond said diffusion areas, and having a first thickness;
    a first wiring at said first level projecting from said first power supply wiring layer along said axis over said first diffusion area and connected to said first diffusion area;
    a second wiring at said first level formed over said second diffusion area along said axis and connected to said second diffusion area;
    a second power supply wiring layer at said second level extending over extensions of said axis beyond said diffusion areas overlapping said end portions of said first power supply wiring layer, and having a second thickness greater than said first thickness; and
    at least one contact hole connecting said first power supply wiring layer to said second power supply wiring layer.

2. The semiconductor device as claimed in claim 1, wherein said second power supply wiring layer is expanded in a direction perpendicular to said axis to provide an expanded portion, said expanded portion of said second power supply wiring layer overlapping with respective portions of said first and second wirings.

3. A semiconductor device as claimed in claim 1, wherein said semiconductor device comprises complementary metal oxide semiconductor transistors, and wherein said first diffusion area comprises a P-channel area and said second diffusion area comprises an N-channel area.

4. A MOS inverter semiconductor device having a multilevel wiring structure including wiring layers at a first level and wiring layers at a second level, comprising:
    a P-channel diffusion area and an N-channel diffusion area in a surface of the semiconductor device spaced apart along an axis connecting said diffusion areas;
    a first power supply wiring layer at said first level extending [in said first direction apart from said P-channel diffusion area and apart from said N-channel diffusion area over said axis and having end portions over extensions of said axis beyond said diffusion areas, and having a first thickness;
    a first wiring at said first level projecting from said first power supply wiring layer along said axis over said P-channel diffusion area and connected to said P-channel diffusion area;
    a second wiring at said first level formed over said N-channel diffusion area along said axis and connected to said N-channel diffusion area;
    a second power supply wiring layer at said second level overlapping said end portions of said first power supply wiring layer and having a second thickness greater than said first thickness; and
    at least one contact hole connecting said first power supply wiring layer to said second power supply wiring layer, said first power supply wiring layer and said second power supply wiring layer being disposed in parallel to each other.

5. The MOS inverter semiconductor device as claimed in claim 4, wherein said second power supply wiring layer extends in a direction perpendicular to said axis to provide an extended portion, said extended portion of said second power supply wiring layer overlapping with respective portions of said first and second wirings.

6. A ring oscillator semiconductor device having a multilevel wiring structure including wiring layers at a first level and wiring layers at a second level, comprising:
    a plurality of MOS inverter cells, each of which including:
        a first diffusion area and a second diffusion area in a surface of the semiconductor device spaced apart along an axis connecting said diffusion areas;
        a first power supply wiring layer at said first level extending over said axis and having end portions over extensions of said axis beyond said diffusion areas, said end portions having a first width along said axis;
        a first wiring at said first level projecting from said power supply wiring layer along said axis over said first diffusion area and connected to said first diffusion area;
        second wiring at said first level formed over said second diffusion area along said axis and connected to said second diffusion area;
        a second power supply wiring layer at said second level extending over extensions of said axis beyond said diffusion areas overlapping said end portions of said first power supply wiring layer and having a second width along said axis greater than said first width;
        a third wiring at said second level interconnecting respective input and output terminals on adjacent ones of said plurality of MOS inverters; and
        at least one contact hole connecting said first power supply wiring layer to said second power supply wiring layer, said first power supply wiring layer and said second power supply wiring layer being disposed in parallel to each other.

7. The ring oscillator semiconductor device as claimed in claim 6, wherein said second power supply wiring layer extends in a direction perpendicular to said axis to provide an extended portion, said extended portion of said second power supply wiring layer overlapping with respective portions of said first and second wirings.

8. A ring oscillator semiconductor device as claimed in claim 6, wherein each of said MOS inverter cells is made of complementary metal oxide semiconductor transistors, and wherein said first diffusion area comprises a P-channel area and wherein said second diffusion area comprises an N-channel area.

9. A semiconductor device having a multi-level wiring structure of at least first and second levels, comprising:

a p-type diffusion area (4) and an n-type diffusion area (3) adjacent to each other along an axis connecting said diffusion areas, each of said p-type and said n-type diffusion areas comprising a first and a second part adjacent to each other in a direction generally perpendicular to said axis;

first primary (1b) and secondary (1c) power supply wiring layers at said first level and extending beyond the first and the second parts of said p-type and said n-type diffusion areas in a direction generally perpendicular to said axis;

first primary and secondary wirings at said first level projecting along said axis from said first primary and secondary power supply wiring layers, respectively, over and connected to the first parts of said p-type and said n-type diffusion areas, respectively;

a second wiring at said first level projecting along said axis over and connected to both the second parts of said p-type and said n-type diffusion areas;

second primary (2b) and secondary (2c) power supply wiring layers at said second level overlapping said first primary and secondary power supply wiring layers, respectively, and being wider along said axis than said first primary and secondary power supply wiring layers, respectively; and at least two contacts connecting said first and said second primary power supply wiring layers together and said first and said second secondary power supply wiring layers together, respectively.

10. A semiconductor device as claimed in claim 9, further comprising a gate electrode between the first parts of said p-type and said n-type diffusion areas, said multi-level wiring structure further comprising a third level over the second level which is over said first level, wherein said semiconductor device further comprises:

a third wiring at said second level extending in a direction generally perpendicular to said axis and connected to said gate electrode; and a fourth wiring at said third level extending along said axis and connected to said second wiring.

11. A ring oscillator semiconductor device having a multi-level wiring structure of first, second, and third levels, comprising a plurality of cyclically connected MOS inverter cells, each of which comprises:

a p-type diffusion area (4) and an n-type diffusion area (3) adjacent to each other along an axis connecting said diffusion areas, each of said p-type and said n-type diffusion areas comprising a first and a second part adjacent to each other;

first primary (1b) and secondary (1c) power supply wiring layers at said first level extending beyond the first and the second parts of said p-type and said n-type diffusion areas in a direction generally perpendicular to said axis;

first primary and secondary wirings at said first level extending along said axis and projecting from said first primary and secondary power supply wiring layers, respectively, over and connected to the first parts of said p-type and said n-type diffusion areas, respectively;

a second wiring at said first level extending along said axis over and connected to both the second parts of said p-type and said n-type diffusion areas;

second primary (2b) and secondary (2c) power supply wiring layers at said second level overlapping said first primary and secondary power supply wiring layers, respectively, and being wider than said first primary and secondary supply wiring layers along said axis, respectively;

at least two contacts connecting said first and said second primary power supply wiring layers together, respectively;

a gate electrode area between the first parts of said p-type and said n-type diffusion areas;

a third wiring at said second level extending in a direction generally perpendicular to said axis over and connected to the gate electrode of a first one of said MOS inverter cells to provide a lead for said gate electrode outwardly of said ring oscillator device; and a fourth wiring at said third level extending along said axis and connected to said third wiring and to the second wiring of a second one of said MOS inverter cells that is adjacent to said first one of MOS inverter cells.

* * * * *